(12) United States Patent
Salvi et al.

(10) Patent No.: US 7,720,448 B2
(45) Date of Patent: May 18, 2010

(54) SIGNAL GENERATION POWER MANAGEMENT CONTROL SYSTEM FOR PORTABLE COMMUNICATIONS DEVICE AND METHOD OF USING SAME

(75) Inventors: Raul Salvi, Boca Raton, FL (US); Cesar Carralero, Miramar, FL (US); Steven P. Hoggarth, Sunrise, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 1834 days.

(21) Appl. No.: 10/748,735

(22) Filed: Dec. 30, 2003

(65) Prior Publication Data

US 2005/0148300 A1    Jul. 7, 2005

(51) Int. Cl.
*H04B 1/04* (2006.01)

(52) U.S. Cl. .............. 455/127.1; 455/67.11; 455/127.2; 455/127.3

(58) Field of Classification Search ............... 455/127.1, 455/63.1, 67.11, 67.13, 251.1, 234.1, 234.2, 455/235.1, 236.1, 574, 522, 115.1, 127.2, 455/127.3, 343.1; 341/144, 139, 143
See application file for complete search history.

(56) References Cited

U.S. PATENT DOCUMENTS

| | | | |
|---|---|---|---|
| 5,329,251 A | 7/1994 | Llewellyn | |
| 5,621,763 A | 4/1997 | Walczak et al. | |
| 5,940,291 A | 8/1999 | Dawson et al. | |
| 6,130,541 A | 10/2000 | Ozguc | |
| 6,134,430 A | 10/2000 | Younis et al. | |
| 6,353,346 B1 | 3/2002 | Chan | |
| 6,614,300 B2 | 9/2003 | Mages | |
| 6,671,371 B1 | 12/2003 | McNeill et al. | |
| 6,731,916 B1 | 5/2004 | Haruyama | |
| 6,795,712 B1 | 9/2004 | Vakilian et al. | |
| 6,864,817 B1 * | 3/2005 | Salvi et al. | 341/139 |
| 6,973,297 B1 * | 12/2005 | Manku et al. | 455/323 |
| 7,089,146 B1 * | 8/2006 | D'Aquino et al. | 702/132 |
| 7,236,756 B2 * | 6/2007 | McGinn | 455/193.1 |
| 7,295,813 B2 * | 11/2007 | Haub et al. | 455/67.13 |
| 2004/0080441 A1 * | 4/2004 | Plymale et al. | 341/144 |
| 2004/0248516 A1 | 12/2004 | Demir et al. | |
| 2005/0113948 A1 * | 5/2005 | Own | 700/94 |

OTHER PUBLICATIONS

Office Action in counterpart Chinese patent application 200480035610.X. issued Apr. 3, 2009.
EPC Search Report for coordinating EPC Application No. EP04810938.

* cited by examiner

*Primary Examiner*—Pablo N Tran
(74) *Attorney, Agent, or Firm*—Charles W. Bethards

(57) ABSTRACT

A signal generation power management control system (100) for use in a portable communications device includes a digital signal processor (DSP) (101) for processing a digital source input and providing a digital processed bit stream A digital-to-analog converter (DAC) (103) is used for converting the digital processed bit stream to provide an analog signal. A power management controller (115) within the DSP (101) is then used for interpreting control parameters of signal processing components used within the portable communications device and dynamically adjusting the bias current of these components based on minimal signal requirements of the analog signal.

19 Claims, 2 Drawing Sheets

SIGNAL GENERATION POWER MANAGEMENT CONTROL SYSTEM FOR PORTABLE COMMUNICATIONS DEVICE AND METHOD OF USING SAME

TECHNICAL FIELD

This invention relates in general to power management and more particularly to power management in signal generation devices such as digital-to-analog converters (DAC), filters, buffer stages and amplifiers.

BACKGROUND

The use of digital-to-analog converter technology is well known and widely used to convert information from a stream of digital information such as voice or data into an analog signal. Once in the analog domain, signals can either be applied to any type of filter, mixer or speaker so that the analog signals can be heard and/or interpreted by a machine or the human ear or they may be mixed with another analog signal and transmitted.

Prior art signal generation topologies such as used with a DAC often were designed for situations to provide the best possible analog information for a given digital signal. This "over design" results both in a greater degree of circuit design area and an excessive current drain on a portable device that might use the DAC. In many instances, the DAC may be interpreting digital information having a very low bit resolution while still operating as if the incoming digital information uses a digital protocol having a high bit resolution.

Moreover, many digital protocols do not require low noise or low intermodulation distortion products, yet the DAC and other signal processing components still process all incoming digital information in the same fashion. This often requires a greater degree of mathematical computation, processing, higher signal drive capability, higher clock speed and an overall greater current demand on a portable device using these components. In many instances, the DAC has been required to operate in this manner to meet published Telecommunications Industry Association (TIA) communications standards where a high-quality analog output signal is required to be produced from a high-resolution digital signal. Although the best digital-to-analog matching is not always required, the DAC and other processing components are operationally fixed for best case digital signaling conditions in order to produce the highest quality analog output. This approach becomes costly since the analog output from the DAC cannot be dynamically changed based on the type of digital signal received and the quality of analog output that is required.

Thus, the need exists to provide an adaptive system and method used with a DAC and other signaling processing components to dynamically control their dynamic range, output drive capability, signal amplitude swing and spectral content. The adaptive system should allow the signal processing requirements of these devices to be dynamically varied. This will enable the most efficient use of power in a portable communications device in order to best accommodate the type of digital information received and the quality of analog output required for a given digital input. This will enable the DAC and signaling processing components to conserve power when a high-quality analog output is not required, thereby allowing a portable communications device to dynamically manage its power consumption.

SUMMARY OF THE INVENTION

Briefly, according to the invention, there is provided a dynamic power management system for a portable communications device typically used with a DAC or similar digital signal processing components. The invention allows a bias controller located within a digital signal processor (DSP) to adjust bias current and related system components such as a DAC, analog filter, mixer power amplifier and related signal generation components to meet minimal analog signal requirements and to minimize current drain when used in a portable communications device. The DSP bias controller controls supply bias based on the incoming multiple access digital protocol (MA), signal amplitude swing and bandwidth for adjusting supply bias to achieve the appropriate noise figure and distortion requirements. The bias controller may also control a reference capacitance in the DAC, signal generation or processing components for adjusting slew rate.

BRIEF DESCRIPTION OF THE DRAWINGS

The features of the present invention, which are believed to be novel, are set forth with particularity in the appended claims. The invention, together with further objects and advantages thereof may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
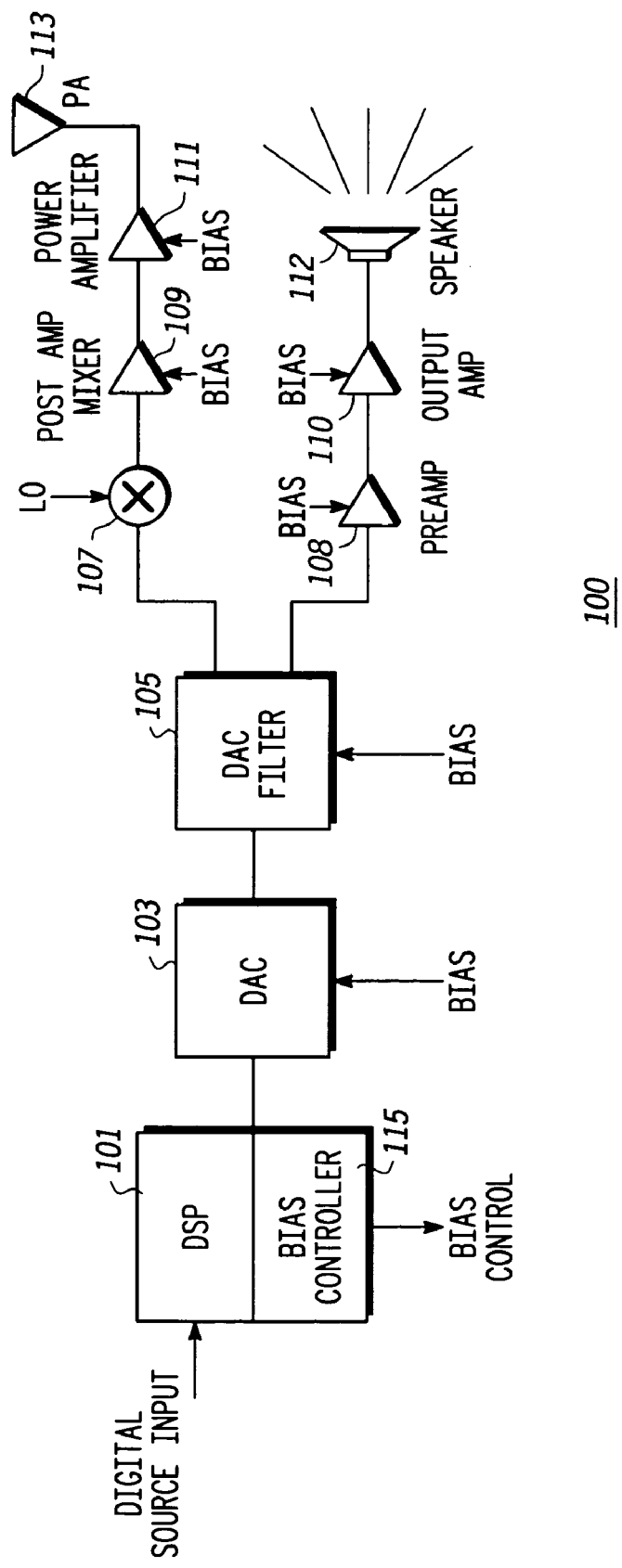
FIG. 1 is a block diagram showing the power management system of the present invention as used with a digital-to-analog converter (DAC) and other signal processing components controlled by a digital signal processor (DSP).

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, a block diagram of the digital-to-analog converter (DAC) power control system 100 includes a digital signal processor (DSP) 101 that is used for processing a digital source input 101. The digital source input 101 may typically be a vocoder or the like that produces both voice data and control data used to convey both voice communications, handshaking and control information over the transmitter or receiver sections of a digital communications system. As will become evident to those skilled in the art, the invention may apply to the digital audio section of any type of portable communications device such as a cellular telephone, two-way radio or compact disc (CD) player. The DSP 101 processes or formats the digital signal in a predetermined manner so as to produce a digitally modulated bit strewn The digital bit stream is applied to a DAC 103 which converts the digital bit stream into an analog modulated output signal.

The analog output modulated signal is then typically applied to a DAC filter 105 which can further shape or manipulate the frequency response of the analog signal. In the transmit mode, this filtered signal is applied to mixer 107. After mixing with a local oscillator (LO) signal, an intermediate frequency (IF) signal is produced by mixer 107 that is applied to a post mixer amplifier 109. The IF signal is a radio frequency (RF) signal that can be transmitted using a two-way portable communications device such as a cellular telephone or two-way radio or the like. The post mixer amplifier 109 is then used to increase the amplitude of the IF signal that may be at radio frequency (RF) such that it can be applied to power amplifier 111 and transmitted using antenna 113. As seen in FIG. 1, in the receive mode the filtered signal from the DAC filter 105 is applied to a pre-amplifier 108, output audio amplifier 110 and speaker 112. As will be evident to those skilled in the art, the invention may also be used in connection with an portable analog audio output system such as a compact disc (CD) player (not shown) in order to achieve the most efficiency and least amount of current drain.

In accordance with the preferred embodiment of the invention, the DAC power control system 100 includes a power management controller 115 within the DSP 101 that works to control processing components in the transmitter and receiver of the communications device. Since the DSP 101 determines the amplitude, frequency and protocol of the incoming digital signal that is processed, the power management controller 115 can work to adjust the bias current used by the DAC 103, DAC filter 105. In the transmitter section, the bias controller 115 controls the post mixer amplifier 109 and power amplifier 111, depending on the quality of analog signals required from the DAC 103. The DAC 103, DAC filter 105, mixer 107, post mixer amplifier 109, power amplifier 111, preamp 108 and output amplifier 110, include a separate supply bias control which is used to precisely control the amount of current drain of the device. Thus, the power management controller 115 controls the pre-amplifier 108 and output audio amplifier 110 that are used to provide audio output. The power management controller 115 works to determine the minimum required supply bias current for the specific multiple access digital protocol (MA) determined by the DSP 101.

This determination is based upon the minimum required noise figure and distortion of the analog output signal from the DAC 103. Moreover, the power management controller 115 can also control a reference capacitance value within the a DAC 103, DAC filter 105, mixer 107, post mixer amplifier 109, power amplifier 111 as well as a transmitter section that includes pre-amplifier 108, and output audio amplifier 110. This reference capacitance value is used for adjusting slew rate of these components to meet distortion requirements. As will be recognized by those skilled in the art, slew rate is the term used to describe how quickly the potential on a circuit node must change with respect to time. As a result, the slew rate is the rate of change of a voltage as measured in volts per second (V/S). Typically the slew rate is not limited in digital circuit design since it is desirous to have the digital circuit slew quickly enough to preserve the original waveform shape during transmission. However, a factor which does slow this rate is capacitance. A reference capacitance used by the portable communications device can be controlled in order to maintain some predefined slew rate and distortion level. The current in the reference capacitance operates using the equation:

$I=C (dv/dt)$ where $I$ is current in amps, $C$ is capacitance in farads, $dv$ is the change in voltage and $dt$ is the change in time.

Hence, the current used by the reference capacitance will increase with either an increase in reference capacitance value or with an increase in voltage per the same operating time period. Since the invention operates to vary the value of this reference capacitance, the current drain of the capacitance can be lessened for the same change in voltage over time. Ultimately, this enables the power used by the DAC 103, DAC filter 105, post mixer amplifier 109, and power amplifier 111 in the transmitter, the pre-amplifier 108 and output amplifier 110 in the receiver, including other associated components, to be dynamically managed based on predetermined desired analog signal parameters. This ensures that only a minimal current is used by the power management system to charge the reference capacitance in order to control current drain in the portable communications device.

Figure 2:
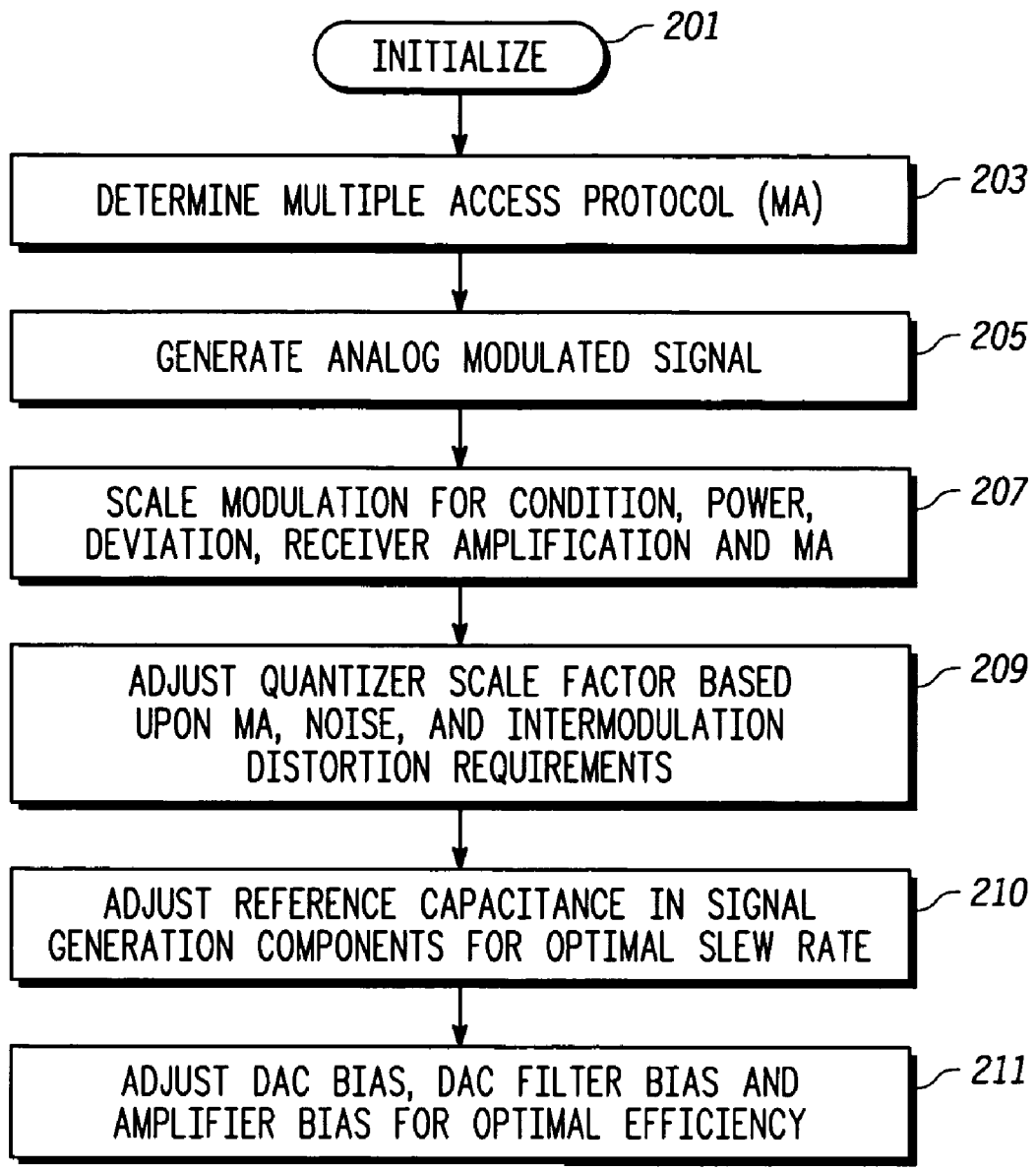
FIG. 2 is a flow chart diagram showing the power management when used with the DAC according to the preferred method of the invention.

With regard to FIG. 2, a flow chart diagram showing the preferred method of using the DAC power management control system 200 includes first initializing 201 the device using the invention where the bias used by the components in the device is set to a predetermined value. A digital multiple access protocol (MA) is then determined 203, and a digitally modulated bit stream is generated 205 typically from a DSP. By using a DAC, the digitally modulated bit stream is scaled 207 such that the digital bit stream is converted into an analog signal. As is known in the art, the digital bit stream may be scaled for condition, power, deviation, MA or the particular type of receiver architecture requirements.

The quantizer within the DAC can then be adjusted 209 such that specific scale factor, i.e., a minimum bias needed to operate the DAC and other processing components, can be selected based upon the MA, signal amplitude swing and signal bandwidth and desired noise figure or inter-modulation distortion (IMD) requirements. Moreover, a reference capacitance with the DAC or other processing components can be adjusted to control slew rate and the most optimal power efficiency. This adjustment is important since slew rate and noise figures are inverse relations. With an increase in capacitance there is a proportional decrease in slew rate and thermal noise. This balance between capacitance, slew rate and noise is taken into account when attempting to adjust for maximum power efficiency of the portable communications device.

In order to ensure that only the lowest bias current is used to satisfy minimal desired analog signal requirements, a DAC buffer, DAC filter, mixer or power amplifiers can further be adjusted 211 to dynamically control power used by a communications device using the method of the instant invention. Once these adjustments have been made, the method enables a continual dynamic power adjustment using a loop, whereby these steps are repeated and incoming digital information can continually be processed by a DSP. This enables the power management control system 200 to continually reevaluate the incoming digital bit stream to maintain a minimum current drain based on required analog signal requirements.

Accordingly, the present invention is a dynamic power management system typically used with a DAC or similar digital signal processing components. The invention allows a bias controller located within a DSP to adjust supply bias current of system components such as a DAC, analog filter, mixer and power amplifier to meet minimal analog signal requirements and minimize current drain in a portable communications device. The DSP controls bias based on the MA, noise figure, distortion and may also control a reference capacitance used to control slew rate in the DAC and other signal generation components.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A system for use in a portable communications device comprising:
   a digital signal processor (DSP) for processing a digital source input and providing a digital processed bit stream;
   a digital-to-analog converter (DAC) for converting the digital processed bit stream and providing at least one analog signal; and
   a power management controller within the DSP configured to control power consumption of the portable communications device and for interpreting a plurality of control parameters and dynamically adjusting a bias current used by the DAC based on minimal signal requirements of the at least one analog signal,
   wherein the control parameters include reference capacitance requirements for a predetermined slew rate.

2. A system as in claim 1, wherein the control parameters further include one or more of a digital multiple access protocol (MA), noise requirements, and intermodulation distortion (IMD).

3. A system as in claim 1, further comprising:
   at least one DAC filter for adjusting the at least one analog signal to a desired frequency response.

4. A system as in claim 3, further comprising:
   a mixer for providing an intermediate frequency (IF) signal from the at least one analog signal; and
   a power amplifier for amplifying the IF signal from the mixer.

5. A system as in claim 4, wherein the bias current of the DAC filter, mixer and power amplifier can be dynamically controlled by the power management controller in order to minimize current drain of the portable communications device.

6. A Previously Presented system as in claim 4, wherein the IF signal operates at radio frequency (RF).

7. A system as in claim 4, wherein the power management controller is further for adjusting control parameters of the DAC, the at least one DAC filter, the mixer and the power amplifier based upon digital protocol received by the DSP and analog signal requirements for the portable communications device.

8. A system as in claim 4, wherein the power management controller dynamically adjusts the bias current used by the DAC based upon one or more of a digital multiple access protocol (MA), noise requirements, and intermodulation distortion (IMD) requirements of the portable communications device.

9. A system as in claim 4, wherein one or more control parameters for, respectively, the DAC, the at least one DAC filter, the mixer and the power amplifier may be independently controlled.

10. A system as in claim 4, wherein the power management controller further controls supply bias to an audio processing system in a receiver of the portable communications device.

11. A power management control system for use with signal generation components in a portable communications device comprising:
    a digital signal processor (DSP) for processing a digital bit stream and providing a processed digital signal therefrom;
    a digital-to-analog converter (DAC) for converting the processed digital signal and providing a modulated analog signal;
    at least one DAC filter for controlling the frequency response of the modulated analog signal to produce a filtered signal;
    a mixer for mixing the filter signal with at least one local oscillator signal to produce an intermediate frequency (IF) signal;
    a power amplifier for amplifying the IF signal; and
    a power management controller located within the DSP for adjusting the control parameters of the DAC, at least one DAC filter, mixer and power amplifier based upon digital protocol received by the DSP and minimum analog signal requirements specified by the portable communications device,
    wherein the adjusting control parameters include adjusting supply bias based upon reference capacitance requirements for achieving a predetermined slew rate.

12. A power management control system as in claim 11, wherein the adjusting control parameters further include adjusting supply bias based upon one or more of a determination of a digital multiple access protocol (MA), system noise requirements, and intermodulation distortion (IMD) requirements.

13. A power management control system as in claim 11, wherein control parameters for the DAC, the at least one DAC filter, mixer and power amplifier may be independently controlled.

14. A power management control system as in claim 11, wherein the power management controller further controls supply bias to an audio processing system in a receiver of the portable communications device.

15. A method for managing power to a communications system having at least one digital-to-analog converter (DAC) comprising the steps of:
    initializing the components used within a portable communications system;
    receiving an incoming digital input stream at a digital signal processor (DSP);
    determining the digital multiple access protocol (MA) used in the digital input stream;
    generating a processed digital signal from the DSP;
    converting the processed digital signal to an analog signal using a DAC; and
    controlling a supply bias used by the DAC based upon a reference capacitance in the DAC for controlling slew rate, the MA, and one or more of noise requirements and intermodulation requirements of the portable communications system.

16. A method for managing power to a communications system utilizing a DAC as in claim 15, wherein the supply bias is controlled by a power management controller in the DSP.

17. A method for managing power to a communications system utilizing a DAC as in claim 16, wherein the power management controller can adjust the reference capacitance in the DAC for controlling slew rate.

18. A method for managing power to a communications system utilizing a DAC as in claim 17, wherein the reference capacitance controls noise and slew rate.

19. A method for managing power to a communications system utilizing a DAC as in claim 15, wherein the DAC is in an audio processing system.

* * * * *